(12) United States Patent
Hosokawa et al.

(10) Patent No.: US 9,698,315 B2
(45) Date of Patent: Jul. 4, 2017

(54) LIGHT EMITTING DEVICE

(71) Applicant: NICHIA CORPORATION, Anan-shi, Tokushima (JP)

(72) Inventors: Shoji Hosokawa, Tokushima (JP); Kimihiro Miyamoto, Tokushima (JP); Daisuke Iwakura, Komatsushima (JP)

(73) Assignee: NICHIA CORPORATION, Anan-Shi (JP)

(*) Notice: Subject to any disclaimer, the term of this patent is extended or adjusted under 35 U.S.C. 154(b) by 12 days.

(21) Appl. No.: 14/926,476

(22) Filed: Oct. 29, 2015

(65) Prior Publication Data

US 2016/0126428 A1 May 5, 2016

(30) Foreign Application Priority Data

Oct. 31, 2014 (JP) .................. 2014-223519
Aug. 25, 2015 (JP) .................. 2015-166277

(51) Int. Cl.
*H01L 33/50* (2010.01)
*H01L 33/54* (2010.01)

(52) U.S. Cl.
CPC ............ *H01L 33/502* (2013.01); *H01L 33/54* (2013.01); *H01L 2224/48247* (2013.01); *H01L 2224/48257* (2013.01); *H01L 2224/73265* (2013.01); *H01L 2224/8592* (2013.01); *H01L 2933/0091* (2013.01)

(58) Field of Classification Search
CPC ............................. H01L 33/502; H01L 33/54
See application file for complete search history.

(56) References Cited

U.S. PATENT DOCUMENTS

| | | |
|---|---|---|
| 5,813,753 A | 9/1998 | Vriens et al. |
| 6,340,824 B1 | 1/2002 | Komoto et al. |
| 2008/0191609 A1* | 8/2008 | Schmidt ............ C09K 11/7787 313/503 |
| 2008/0303411 A1 | 12/2008 | Ohta et al. |
| 2010/0142189 A1 | 6/2010 | Hong et al. |
| 2010/0164364 A1* | 7/2010 | Eida ................... B82Y 20/00 313/499 |

(Continued)

FOREIGN PATENT DOCUMENTS

| | | |
|---|---|---|
| JP | H10-190053 A | 7/1998 |
| JP | H11-145519 A | 5/1999 |

(Continued)

*Primary Examiner* — Fernando L Toledo
*Assistant Examiner* — Valerie N Newton
(74) *Attorney, Agent, or Firm* — Andrews Kurth Kenyon LLP

(57) ABSTRACT

A light emitting device is provided which includes a light emitting element, a phosphor, and a sealing member. The light emitting element has a light emission peak wavelength in the range not shorter than 400 nm and not longer than 460 nm. The phosphor can be excited by light from the light emitting element, and emit luminescent radiation with a light emission peak wavelength in the range in not shorter than 600 nm and not longer than 700 nm. The sealing member includes a pigment for absorbing a part of the light from the light emitting element. X of the light emission chromaticity of the light emitting device falls within the range of $x \geq 0.600$ in the chromaticity coordinates in the CIE 1931 color space chromaticity diagram.

16 Claims, 8 Drawing Sheets

(56) References Cited

U.S. PATENT DOCUMENTS

| | | |
|---|---|---|
| 2013/0045912 A1 | 2/2013 | Morschhaeuser et al. |
| 2013/0169149 A1 | 7/2013 | Sato et al. |
| 2014/0048834 A1 | 2/2014 | Sato et al. |
| 2015/0241621 A1* | 8/2015 | Inui .................. G02F 1/133615 349/65 |
| 2015/0327446 A1* | 11/2015 | Kawaguchi ............ A01G 7/045 257/98 |

FOREIGN PATENT DOCUMENTS

| | | |
|---|---|---|
| JP | 2001-501380 A | 1/2001 |
| JP | 2001-077433 A | 3/2001 |
| JP | 2001-308393 A | 11/2001 |
| JP | 3809760 B2 | 8/2006 |
| JP | 2009-016779 A | 1/2009 |
| JP | 2011-012091 A | 1/2011 |
| JP | 2011-054958 A | 3/2011 |
| JP | 2011-204406 A | 10/2011 |
| JP | 2012-508464 A | 4/2012 |
| JP | 2013-519232 A | 5/2013 |
| JP | 2013-534541 A | 9/2013 |
| WO | 2009-099211 A1 | 8/2009 |
| WO | 2010/053884 A1 | 5/2010 |
| WO | 2011/097379 A1 | 8/2011 |
| WO | 2012-029695 A1 | 3/2012 |
| WO | 2012-147608 A1 | 11/2012 |
| WO | 2014-136674 A1 | 9/2014 |

* cited by examiner

LIGHT EMITTING DEVICE

CROSS-REFERENCE TO RELATED APPLICATIONS

The present application claims priority under 35 U. S. C. §119 to Japanese Patent Application No. 2014-223,519, filed Oct. 31, 2014, and No. 2015-166,277, filed Aug. 25, 2015. The contents of these applications are incorporated herein by reference in their entirety.

BACKGROUND OF THE INVENTION

1. Field of the Invention

The present disclosure relates to a light emitting device that includes a light emitting element together with a phosphor.

2. Description of the Related Art

In recent years, light emitting diodes (hereinafter also referred to as LEDs), which provide substantial energy savings, are widely used as light emitting elements. In addition, a light emitting device includes a semiconductor light emitting element containing gallium nitride (GaN) and a yellow phosphor which is excited by light from this light emitting element and emits yellow luminescent radiation. This light emitting device can emit white range light by color mixture, and is used for illumination.

Also, in the technical field of illumination, in order to perform stage light rendering or to light up structure such as building and bridge, light rendering is used by various colors of light as well as white light.

LEDs are already known which emit monochromatic red light, green light and blue light corresponding to the primary colors of light. However, in the case where these monochromatic LEDs are used together, the voltages for driving these LEDs are different since the LEDs which emit monochromatic red light, green light and blue light are formed of different types of semiconductors. For this reason, if a light emitting device is constructed of the LEDs which are driven at different voltages, it is necessary to take their different characteristics of the LEDs into consideration. Accordingly, the construction or control means of the light emitting device will be very complicated. As a result, the device itself, and its operational cost may be expensive.

On the other hand, it is conceivable such a monochromatic LED is replaced by a monochromatic light emitting device which includes a light emitting element and a phosphor which is excited light from this light emitting element. For example, International Publication No. WO 2009-099,211 A discloses a light emitting device which includes a light emitting element that emits light from ultraviolet to blue light range, and a phosphor that absorbs the light from this light emitting element and emits a different wavelength of light (wavelength conversion) whereby emitting red light.

For example, as a light emitting device which includes a light emitting element and a phosphor, and emits red light, in the case where a light emitting device includes a light emitting element that emits light containing ultraviolet radiation, and a phosphor that is excited by the ultraviolet radiation, there is a possibility that some members (e.g., resin) of the light emitting device may be deteriorated by the ultraviolet radiation.

In particular, in the case where this type of light emitting device is small, the amount of the phosphor may not be enough to sufficiently absorb light from the light emitting element since the space of the small light emitting device is limited. If the amount of the phosphor is enough, a part of light from the light emitting element is directly extracted from the light emitting device, that is, the light emitting device emits unintended color of light. As a result, there is a problem that the expected color purity of the monochromatic red light emitting device is not achieved.

For example, the phosphor disclosed in WO 2009-099, 211 A has a relatively high reflectance at a wavelength of 450 nm corresponding to the peak wavelength of excitation light from the light emitting element. For this reason, a relatively large amount of the phosphor is required for sufficient absorption of the light for exciting the phosphor. On the other hand, in particular, in the case where a light emitting device is small, the space of the small light emitting device is limited for accommodating the phosphor, that is, a sufficient amount of the phosphor for emitting red light may not be accommodated. In this case, a part of light from the light emitting element which is not absorbed by the red phosphor is extracted from the light emitting device. In other words, a part of blue light is extracted from the light emitting device. As a result, the red color purity of the light emitting device may be insufficient for a red monochromatic light emitting device.

The present invention is devised in light of the disadvantageous features as described above. It is one object of the present invention is to provide a light emitting device capable of emitting monochromatic red light with high color purity.

SUMMARY OF THE INVENTION

To achieve the above object, a light emitting device according to one aspect of the present invention includes a light emitting element, a phosphor, and a sealing member. The light emitting element has a light emission peak wavelength in the range not shorter than 400 nm and not longer than 460 nm. The phosphor can be excited by light from the light emitting element, and emit luminescent radiation with a light emission peak wavelength in the range not shorter than 600 nm and not longer than 700 nm. The sealing member includes a pigment for absorbing a part of the light from the light emitting element. X of the light emission chromaticity of the light emitting device falls within the range of x≥0.600 in the chromaticity coordinates in the CIE 1931 color space chromaticity diagram.

According to the aforementioned construction, a deterioration possibility by ultraviolet radiation is reduced. Therefore, a light emitting device can be provided which can emit red monochromatic light with high color purity even in the case where the light emitting device is small.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF EMBODIMENTS

Figure 1:
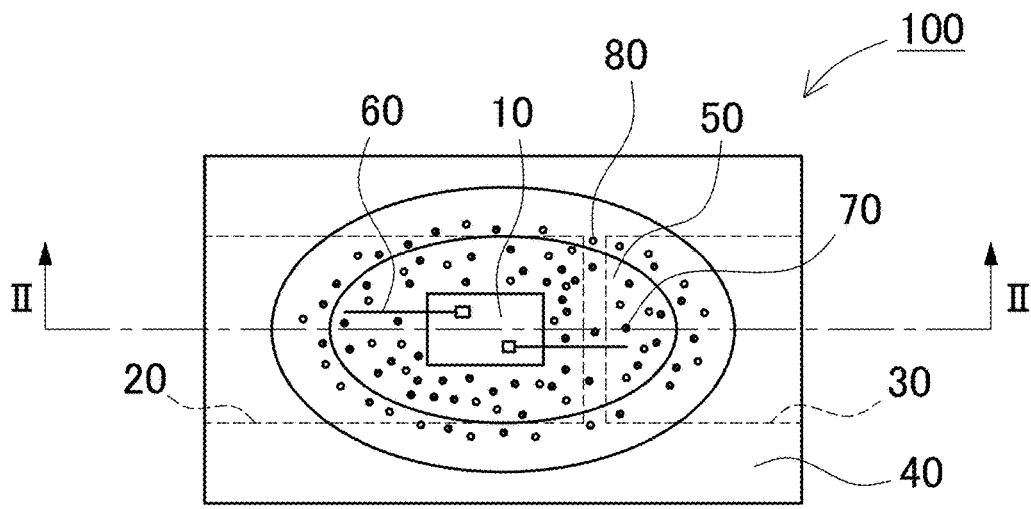
FIG. 1 is a schematic plan view showing a light emitting device according to a first embodiment of the present invention.

The embodiments will now be described with reference to the accompanying drawings, wherein like reference numerals designate corresponding or identical elements throughout the various drawings. It should be appreciated, however, that the embodiments described below are illustrations of a light emitting device to give a concrete form to technical ideas of the invention, and a light emitting device of the invention is not specifically limited to description below. Furthermore, it should be appreciated that the members shown in claims attached hereto are not specifically limited to members in the embodiments. Unless otherwise specified, any dimensions, materials, shapes and relative arrangements of the parts described in the embodiments are given as an example and not as a limitation. Additionally, the sizes and the positional relationships of the members in each of drawings are occasionally shown exaggeratingly for ease of explanation.

In description of the present invention, relationship between color name and chromaticity coordinates, relationship between light wavelength range and monochromatic light, and the like are based on the JIS standard (JIS Z8110). Specifically, the range of 380 to 410 nm corresponds to violet, the range of 410 to 455 nm corresponds to bluish violet, the range of 455 to 485 nm corresponds to blue, the range of 485 to 495 nm corresponds to bluish green, the range of 495 to 548 nm corresponds to green, the range of 548 to 573 nm corresponds to yellowish green, the range of 573 to 584 nm corresponds to yellow, the range of 584 to 610 nm corresponds to apricot, and the range of 610 to 780 nm corresponds to red. In addition, chromaticity values x and y corresponds to values in the chromaticity coordinates in the CIE 1931 color space chromaticity diagram.

Various shapes of light emitting devices including a light emitting element are known such as bullet type and surface mount type light emitting devices. The bullet type light emitting device in this specification refers to a light emitting device that includes a bullet-shaped sealing member for covering a light emitting element, and leads. The light emitting element is mounted on one of the leads. The leads serve as terminals to be connected to the outside. The surface mount type light emitting device refers to a light emitting device that includes a light emitting element, a molded member that includes lead terminals and holds the light emitting element, and a sealing member that is arranged on the molded member and covers the light emitting element. In addition, another type of light emitting device is known which includes a light emitting element, a plate-shaped circuit board on which the light emitting element is mounted, and a sealing member that contains a phosphor and is formed in a lens shape, or the like.

Figure 2A:
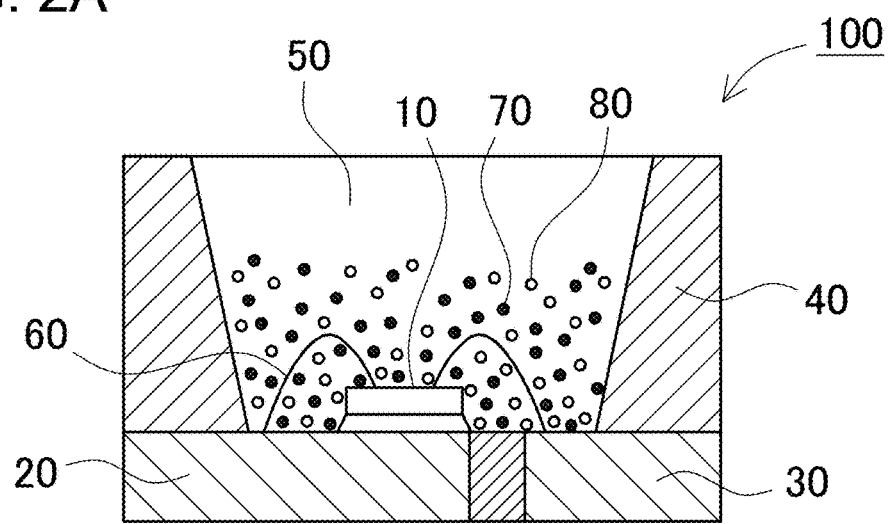
FIG. 2A is a cross-sectional view showing the light emitting device shown in FIG. 1 taken along the line II-II.

A light emitting device according 100 to a first embodiment of the present invention is now described with reference to FIGS. 1 and 2A. Specifically, FIG. 1 is a plan view schematically showing the light emitting device 100, and FIG. 2A is a cross-sectional view schematically showing the light emitting device 100 taken along the line II-II in FIG. 1. The light emitting device 100 is an exemplary surface mount type light emitting device. The light emitting device 100 includes a light emitting element 10, and a molded member 40. The light emitting element 10 is mounted on the molded member 40. The molded member 40 has a recessed part (cavity) which is surrounded by the bottom and side surfaces. The light emitting element 10 is arranged on the bottom surface of the recessed part. The molded member 40 includes first and second leads 20 and 30. Parts of the first and second leads 20 and 30 are exposed from the bottom surface of the recessed part. The molded member 40 is integrally formed with the leads 20 and 30, and is formed of a thermoplastic or thermosetting resin. The light emitting element 10 includes a pair of electrodes (positive and negative electrodes). The pair of electrodes (positive and negative electrodes) are electrically connected to the first and second lead terminals 20 and 30 through wires 60. The light emitting element 10 and the wires 60 are covered by a sealing member 50. The sealing member 50 includes a phosphor 70, and a pigment 80. The phosphor 70 absorbs light from the light emitting element 10 and emits a different wavelength of light (wavelength conversion). The pigment 80 absorbs the light emitted by the light emitting element 10, and reflects the light emitted by the phosphor 70. The following description will describe the components of the light emitting device.

(Pigment 80)

As shown in FIGS. 1 and 2A, the sealing member 50 includes the phosphor 70 and the pigment 80. In the embodiment shown in FIG. 2A, the phosphor 70 and the pigment 80 are included in the common sealing member 50. Specifically, the phosphor 70 and the pigment 80 are mixed so as to be substantially uniformly distributed in the sealing member 50. In this embodiment, in the production of the light emitting device, only a step for mixing the phosphor, the pigment and the material of the sealing member is required for preparation of the sealing member. For this reason, the workability can be high in the production of the light emitting device according to this embodiment as compared with other embodiments which will be described later.

In order to efficiently absorb light from the light emitting element 10 that will pass through the sealing member 50 without absorbed by the phosphor 70, the pigment 80 is arranged around the light emitting element 10 and the phosphor 70.

The reflectance of the pigment 80 is not greater than 40% in the wavelength range not shorter than 400 nm and not longer than 460 nm within which the light emission peak wavelength of the light emitting element 10 for exciting the red phosphor 70 falls. It is preferable that the reflectance of the pigment 80 is not greater than 39% in this wavelength range. It is more preferable that the reflectance of the pigment 80 is not greater than 38% in this wavelength range. The pigment 80 which has a reflectance falling within the above reflectance range can absorb blue light component, which is not intended to be extracted from red monochromatic light emitting device, while surely providing a light component for exciting the red phosphor.

In addition, it is preferable that the reflectance of the pigment 80 is not smaller than 75% in the wavelength range not shorter than 600 nm and not longer than 700 nm. It is more preferable that the reflectance of the pigment 80 is not smaller than 78% in this wavelength range. It is most preferable that the reflectance of the pigment 80 is not smaller than 80% in this wavelength range. In the case where the reflectance of the pigment 80 falls within the above reflectance range, absorption of light from the red phosphor by the pigment can be suppressed. As a result, monochromatic red light can be efficiently extracted from the light emitting device.

That is, since the light emitting device according to this embodiment includes the aforementioned pigment, x of the light emission chromaticity of the light emitting device can fall within the range of x≥0.600 in the chromaticity coordinates in the CIE 1931 color space chromaticity diagram. It is preferable that x satisfies x≥0.610. It is more preferable that x satisfies x≥0.620.

In addition, the ratio of the light emission intensity of the light emitting device at the light emission peak wavelength of the light emitting element is not greater than 0.10 with respect to the maximum light emission intensity of the light emitting device in the range not shorter than 600 nm and not longer than 700 nm. It is preferable that the light emission intensity ratio is not greater than 0.05. It is more preferable that the light emission intensity ratio is not greater than 0.02.

Although the material of the pigment is not specifically limited, it can be an inorganic or organic material, for example. Exemplary materials can be provided as follows.

Exemplary inorganic materials can be provided by iron red ($Fe_2O_3$), red lead ($Pb_3O_4$), antimony-nickel-titanium-based oxide, barium-nickel-titanium-based oxide, antimony-chromium-titanium-based oxide, and niobium-chromium-titanium-based oxide.

Exemplary organic materials can be provided by anthraquinone-based, azo-based, quinacridon-based, perylene-based, diketopyrrolopyrrole-based, monoazo-based, disazo-based pyrazolone-based, benzimidazolone-based, quinoxaline-based, azomethine-based, isoindolinone-based and isoindoline-based materials.

In particular, antimony-nickel-titanium-based oxide which can be represented by the composition formula $(Ti, Ni, Sb)O_2$, and iron red ($Fe_2O_3$) are preferable since they are relatively easily available.

The pigment according to this embodiment is preferably a particle material. The mean particle diameter is not larger than 10 μm. The specific surface of the pigment particle becomes larger as the mean particle diameter becomes smaller. For this reason, the pigment which has a mean particle diameter falling within the above range can efficiently absorb blue light from the light emitting element that is not absorbed by the red phosphor and is unintended to be extracted from the light emitting device. In addition, the mean particle diameter of the pigment is preferably smaller than the mean particle diameter of the red phosphor. The reason is that the amount of light from the light emitting element absorbed by the pigment is larger, and the amount of light absorbed by the red phosphor is smaller if the mean particle diameter of the pigment is larger than the mean particle diameter of the red phosphor.

In this specification, the term "mean particle diameter" refers to a mean particle diameter measured by aperture's electrical resistance method (electrical sensing zone method) based on the Coulter principle. The aperture's electrical resistance method is a particle measurement method using electric resistances of particles. Specifically, the method obtains the diameters of particles of the phosphor or the filler material in accordance with their electric resistances produced when they pass an aperture of an aperture tube after they are distributed in an electrolytic solution.

Figure 2B:
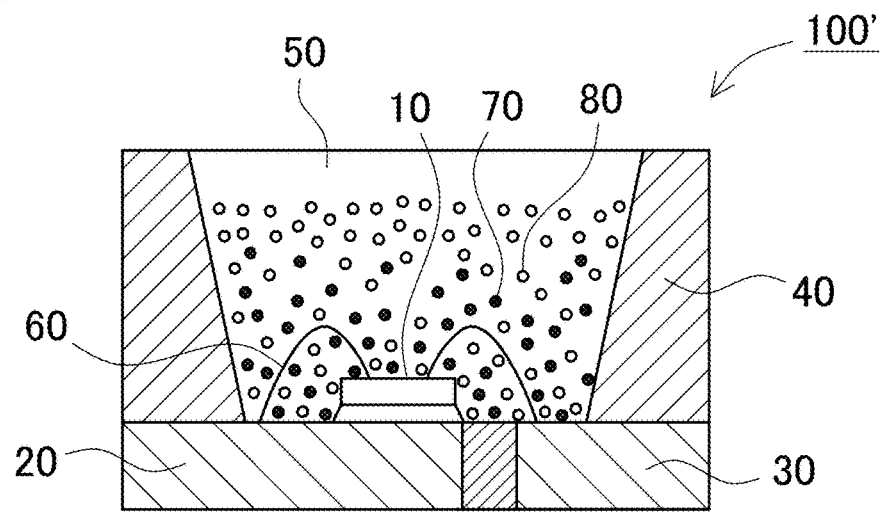
FIG. 2B is a cross-sectional view showing a modified light emitting device taken along a line corresponding to the line II-II in FIG. 1.

In the embodiment shown in FIG. 2A, the phosphor 70 as well as the pigment 80 is mixed in the common sealing member 50. That is, the phosphor 70 and the pigment 80 can be distributed in the common member. Although it has been described that the pigment 80 is uniformly mixed with the phosphor 70 in the sealing member 50, the pigment 80 can be locally distributed on the exterior side of the phosphor 70 instead of uniform distribution in the sealing member 50. For example, in the process for forming the sealing member, the phosphor 70 can be settled faster than the pigment 80 by using the difference between sedimentation velocities of the phosphor 70 and the pigment 80 which are previously adjusted so that the pigment 80 is locally distributed above the phosphor 70 in the material of the sealing member 50. It is preferable that the phosphor 70 which has a greater specific gravity than the pigment 80 is locally distributed by a centrifugal separator, and is settled faster than the pigment 80. A light emitting device 100' which is produced by this process for forming the sealing member includes a portion that substantially contains neither the phosphor 70 nor the pigment 80, a portion that has a higher content of the pigment 80 than the content of the phosphor 70 (preferably contains the pigment 80 but contains substantially no phosphor 70), and a portion that contains mixture of the phosphor 70 and the pigment 80 in this order from the upper surface of the sealing member 50 toward the light emitting element 10 as shown in the cross-sectional view of FIG. 2B. Alternatively, a process for arranging the phosphor, and a process of arranging the pigment may be separately conducted. That is, after the material containing the phosphor may be arranged, the material containing the pigment may be arranged on the material containing the phosphor. As a result, the pigment can be positioned above the phosphor. The light emission efficiency tends to be higher in the case where the phosphor and the pigment are separately arranged as discussed later in examples of the present invention. In the case where the light emitting device 100' shown in FIG. 2B is produced, it is unnecessary to separate the process that the process for arranging the phosphor from the process for arranging the pigment. Since a portion that has a higher content of the pigment can be formed on a portion that contains the phosphor by a common process using the sedimentation difference in the case where the light emitting device 100' shown in FIG. 2B is produced, the production of the light emitting device can be simple.

(Light Emitting Element 10)

The light emitting element 10 emits light having a light emission peak wavelength in the range from the range from ultraviolet light to visible light whereby exciting the phosphor. The light emission peak wavelength of the light emitting element 10 preferably falls within the range not shorter than 240 nm and not longer than 520 nm, and more preferably the range not shorter than 400 nm and not longer than 460 nm in consideration of excitation of the phosphor 70. For example, a nitride semiconductor element ($In_xAl_yGa_{1-x-y}N$, 0≤x, 0≤y, x+y≤1) can be used as the light emitting device 10.

The light emitting element 10 includes semiconductor layers of nitride semiconductors. The semiconductor layers include n-type, active, and p-type layers that are deposited in this order on or above a sapphire substrate. An n-pad electrode is formed on an exposed part of the n-type semiconductor that extends in a line which extends in a wafer before the wafer is divided into chips. On the other hand, a p-pad electrode is formed on a p-ohmic electrode. The light emitting element 10 preferably includes the active layer which has a light emission peak wavelength in the range from about 240 to 520 nm and can emit light with a light emission wavelength capable of efficiently exciting the phosphor. Although the nitride semiconductor light emitting element has been illustratively described as the light emitting element 10, the light emitting element according to the present invention is not limited to this.

The light emitting element 10 emits light having a light emission peak wavelength in the aforementioned wavelength range. At least one phosphor 70 is excited by the light from the light emitting element 10. As a result, the light emitting device emits predetermined color light. In addition, this light emitting element 10 can have a narrow width of light emission spectrum. For this reason, the light emitting element 10 can efficiently excite the phosphor.

(Phosphor 70)

The phosphor 70 according to the first embodiment is distributed in the sealing member 50. The sealing member 50 serves not only as a member for protecting the light emitting element 10 and the phosphor 70 from the external environments but also as a wavelength conversion member for absorbing a part from the light of the light emitting element 10 for wavelength conversion. In the case where the sealing member 50 including the phosphor 70 is arranged in proximity to the light emitting element 10, the light from the light emitting element 10 can be efficiently converted into light with a different wavelength from the light from the light emitting element 10. As a result, the light emitting device can have a high light emission efficiency. However, the sealing member 50 including the phosphor 70 is not limited to be arranged in proximity to the light emitting element 10. In consideration of influence of heat on the phosphor 70, the wavelength conversion member containing the phosphor 70 can be spaced at a certain interval from the light emitting element 10. Also, the phosphor 70 can be mixed in the sealing member 50 at a substantially even ratio whereby reducing color unevenness of light.

The phosphor according to this embodiment includes a phosphor material which has a light emitting peak falling within the range not shorter than 600 nm and not longer than 700 nm, which corresponds to the range from red light to apricot light (hereinafter, also referred to as the "red phosphor"). The red phosphor is preferably activated by $Mn^{4+}$ as an activator. The red light emitted by the phosphor which contains $Mn^{4+}$ as an activator has a narrow half-value width of light emission spectrum. Accordingly, the light emitting device which includes this phosphor can have high red purity.

Examples of the phosphor activated by $Mn^{4+}$ can be provided by the following general formulas (I) and (II). More specifically, examples of the phosphor activated by $Mn^{4+}$ can be provided by $K_2SiF_6:Mn^{4+}$, and $3.5MgO \cdot 0.5MgF_2 \cdot GeO_2:Mn^{4+}$ as well as $Mg_2TiO_4:Mn^{4+}$, and the like.

$$A_2[M_{1-a}Mn^{4+}{}_aF_6] \qquad (I)$$

where A is at least one selected from the group consisting of $K^+$, $Li^+$, $Na^+$, $Rb^+$, $Cs^+$ and $NH^{4+}$, M is at least one element selected from the group consisting of the group 4 elements and the group 14 elements, and a satisfies 0<a<0.2.

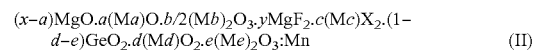

$$(x-a)MgO \cdot a(Ma)O \cdot b/2(Mb)_2O_3 \cdot yMgF_2 \cdot c(Mc)X_2 \cdot (1-d-e)GeO_2 \cdot d(Md)O_2 \cdot e(Me)_2O_3:Mn \qquad (II)$$

where Ma is at least one element selected from the group consisting of Ca, Sr, Ba and Zn, Mb is at least one element selected from the group consisting of Sc, La and Lu, Mc is at least one element selected from the group consisting of Ca, Sr, Ba and Zn, X is at least one element selected from the group consisting of F and Cl, Md is at least one element selected from the group consisting of Ti, Sn and Zr, Me is at least one element selected from the group consisting of B, Al, Ga and In. In addition, x, y, a, b, c, d and e satisfy 2≤x≤4, 0<y≤2, 0≤a≤1.5, 0≤b<1, 0≤c≤2, 0≤d≤0.5 and 0≤e<1, respectively.

The half-value width of the phosphor which is represented by the general formula (I) (hereinafter, referred to as a "KSF phosphor") typically falls within the range not longer than 10 nm. The half-value width of the phosphor which is represented by the general formula (II) (hereinafter, referred to as an "MGF phosphor") typically falls within the range not shorter than 15 nm and not longer than 35 nm.

As represented by the aforementioned general formula (I), in the case of a KSF phosphor having the composition $K_2SiF_6:Mn^{4+}$, Si can be partially substituted by Ti or Si, which is another tetravalent element, (represented by the composition formula $K_2(Si, Ti, Ge)F_6:Mn$). Also, in the case of a KSF phosphor having the composition $K_2SiF_6:Mn^{4+}$, K can be partially substituted by another alkali metal, or Si can be partially substituted by another trivalent element such as Al. In addition, they may be partially substituted by a plurality of elements.

In the case of a MGF phosphor, as represented by the aforementioned general formula (II), when the elements are substituted by other elements, the phosphor can absorb blue light and efficiently emit red light.

The phosphor 70 may contain another phosphor material in addition to the red phosphor material as long as the color purity of red light is available. For example, the light emitting device according to this embodiment may include the light emitting element 10 which emits blue light, and a phosphor material which can be excited by the blue light and emit yellow light together with the phosphor material which can be excited by the blue light and emit red light.

Alternatively, a nitride phosphor or sulfide phosphor may be used as the red phosphor which is not activated by $Mn^{4+}$ instead of or together with the aforementioned the KSF or MGF phosphor, for example. Examples of the nitride phosphor can be provided by such as $(Ca_{1-x}Sr_x)AlSiN_3$:Eu (0≤x≤1.0), $(Ca_{1-x-y}Sr_xBa_y)_2Si_5N_8$:Eu(0≤x≤1.0, 0≤y≤1.0), (Sr,Ca)AlSiN$_3$:Eu, CaAlSiN$_3$:Eu, and (Ca, Sr)LiAl$_3$N$_4$:Eu.

The example of the a sulfide phosphor can be provided by (Ca, Sr, Ba)S:Eu-based phosphor.

The phosphor according to this embodiment is preferably a particle material. The mean particle diameter is not smaller than 1 μm and not larger than 50 μm. The reason is that the light emission efficiency of the phosphor decreases if the mean particle diameter is too small. On the other hand, if the mean particle diameter of the phosphor is too large, the workability will be low in a process for forming the sealing member containing the phosphor in the production of the light emitting device.

According to the light emitting device of the first embodiment, a process can be omitted which locally distributes the phosphor and the pigment or separates the phosphor and the pigment from each other in the sealing member in the production of the light emitting device. For this reason, the light emitting device can be easily produced. As a result, the production workability can be high.

Second Embodiment

It has been described that the red phosphor 70 and the pigment 80 are mixed and distributed in the common sealing member 50 in the light emitting device 100 according to the first embodiment shown in FIGS. 1 and 2A. However, the present invention is not limited to this. The phosphor and the pigment can be included in separated sealing members. This type of light emitting device according to a second embodiment is shown in a cross-sectional view of FIG. 3. In the illustrated light emitting device 200, the sealing member 50 is constructed of a first sealing portion 51 which contains the phosphor 70, and a second sealing portion 52 which contains the pigment 80. In particular, it is preferable that the first sealing portion 51 covers the light emitting element 10, and the second sealing portion 52 covers the first sealing portion 51. Since the phosphor 70 and the pigment 80 are physically separated from each other, and the first sealing portion 51 which includes the phosphor 70 is arranged on the side close to the light emitting element 10, a light emitting device with high color purity can be provided. That is, according to this arrangement, after light (e.g., blue light) is emitted by the light emitting element 10, a part of the blue light which is not absorbed by the red phosphor for excitation and passes through the first sealing portion 51 can be absorbed by the pigment 80 in the second sealing portion 52. Accordingly, mixture of blue light into the light extracted from the light emitting device can be reduced. As a result, a light emitting device with improved color purity can be provided. In other words, reduction of luminescent radiation can be effectively avoided which is caused by absorption of light from the light emitting element before excitation of the phosphor, which will occur in the case where the phosphor and the pigment are mixes in the common sealing member.

Third Embodiment

Figure 3:
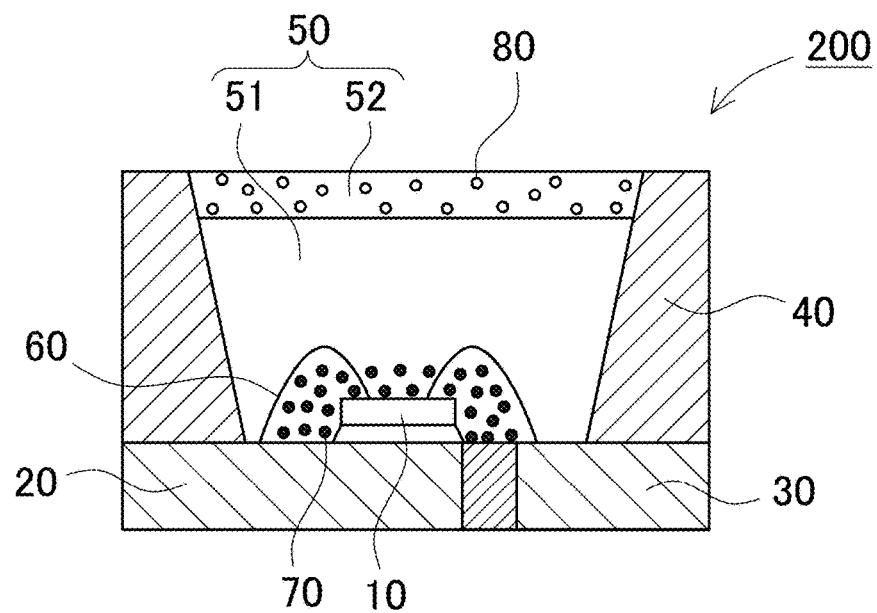
FIG. 3 is a schematic cross-sectional view showing a light emitting device according to a second embodiment of the present invention.
Figure 4:
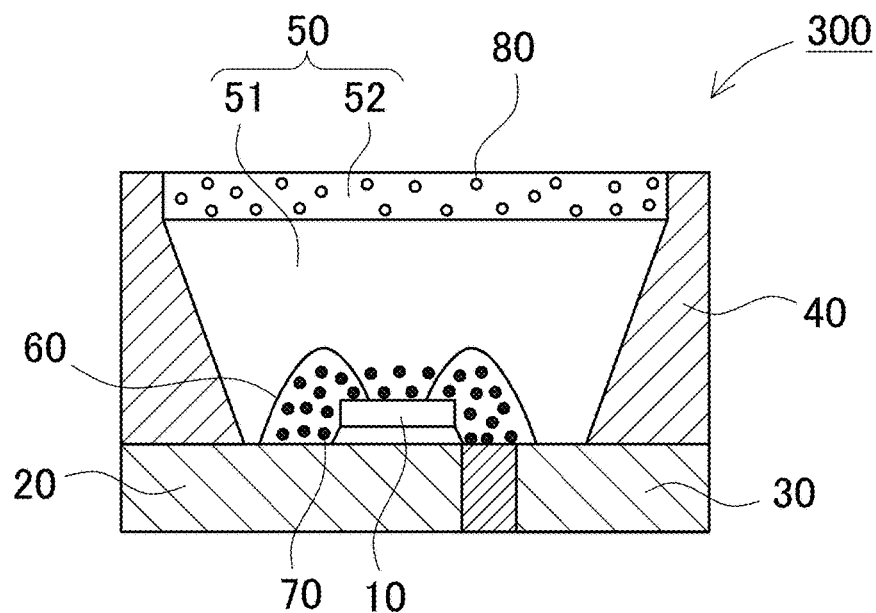
FIG. 4 is a schematic cross-sectional view showing a light emitting device according to a third embodiment of the present invention.

The arrangement of the first and second sealing portions is not limited to the arrangement shown in FIG. 3. Various suitable arrangements can be used for the first and second sealing portions. For example, an angled part is formed on the upper part of the side wall of the molded member 40 in a light emitting device 300 according to a third embodiment shown in FIG. 4. This angled part can be easily formed by changing the inclination of the side wall. The part of the recessed part lower than the angled part is filled with the first sealing portion 51 in which the phosphor 70 is settled. The second sealing portion 52 which includes the pigment 80 is arranged on the first sealing portion 51. According to this arrangement, the second sealing portion 52 can be easily fastened to the upper part of the molded member 40, and is less likely to be removed.

Fourth Embodiment

Figure 5:
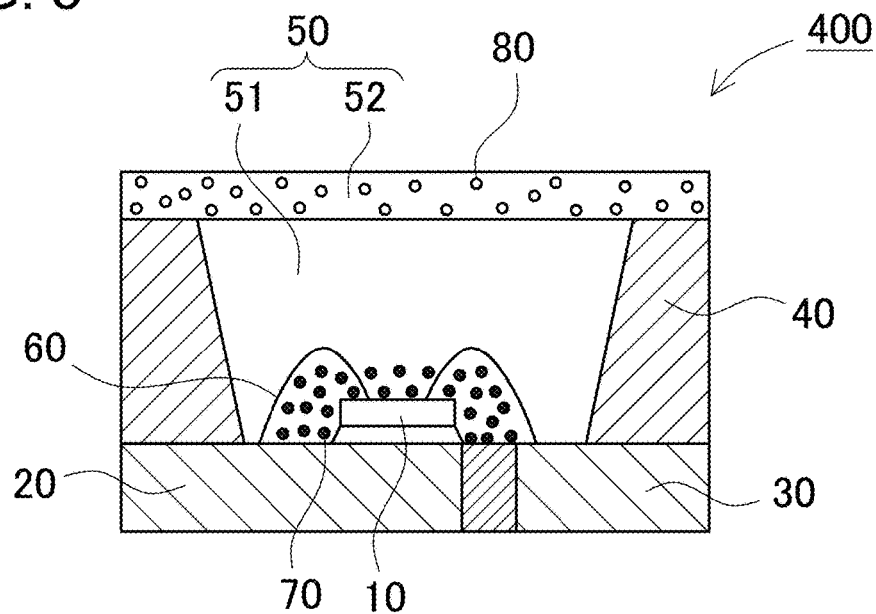
FIG. 5 is a schematic cross-sectional view showing a light emitting device according to a fourth embodiment of the present invention.

The first sealing portion 51 which includes the phosphor 70 is substantially coplanar with the top surface of the side wall of the molded member 40 after the recessed part of the molded member 40 is filled with the first sealing portion 51, and the second sealing portion 52 which includes the pigment 80 is arranged on the top surfaces of the first sealing portion 51 and the side wall of the molded member 40 in a light emitting device 400 according to a fourth embodiment shown in FIG. 5.

Fifth Embodiment

Figure 6:
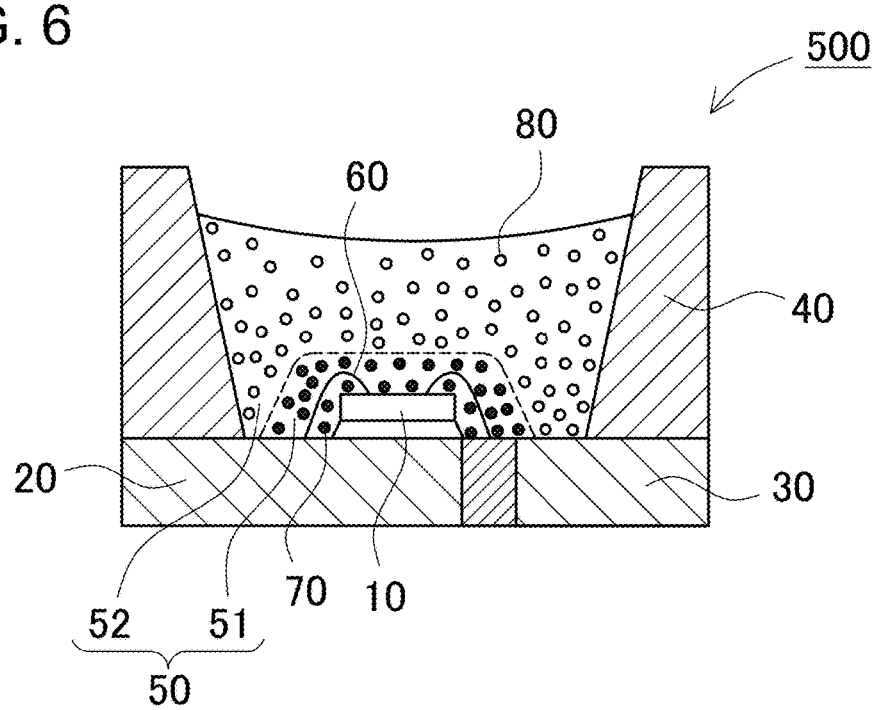
FIG. 6 is a schematic cross-sectional view showing a light emitting device according to a fifth embodiment of the present invention.

The first sealing portion which includes the phosphor and the second sealing portion which includes the pigment are not necessarily formed as clearly separated layers. They can have a blurry boundary or no boundary between them. For example, a common sealing material can serve as the first and second sealing portions so that the phosphor and the pigment can be separated from each other in the common sealing member. This type of light emitting device is shown as a light emitting device 500 according to a fifth embodiment in a cross-sectional view of FIG. 6. In the light emitting device 500, the sealing member 50 is constructed of a first sealing portion 51 which contains the phosphor 70 and covers the light emitting element 10, and a second sealing portion 52 which covers the first sealing portion 51 and contains the pigment 80. To form this sealing member 50, the resin material of the sealing member containing the phosphor 70 can be dropped onto the light emitting element 10, and subsequently the resin material containing the pigment 80 can be dropped. After that, the resin materials can be cured. According to this process, the sealing member 50 which includes the aforementioned first and second sealing portions 51 and 52 can be relatively easily formed so that the phosphor 70 and the pigment 80 can be arranged on or above the light emitting element 10.

Sixth Embodiment

Figure 7:
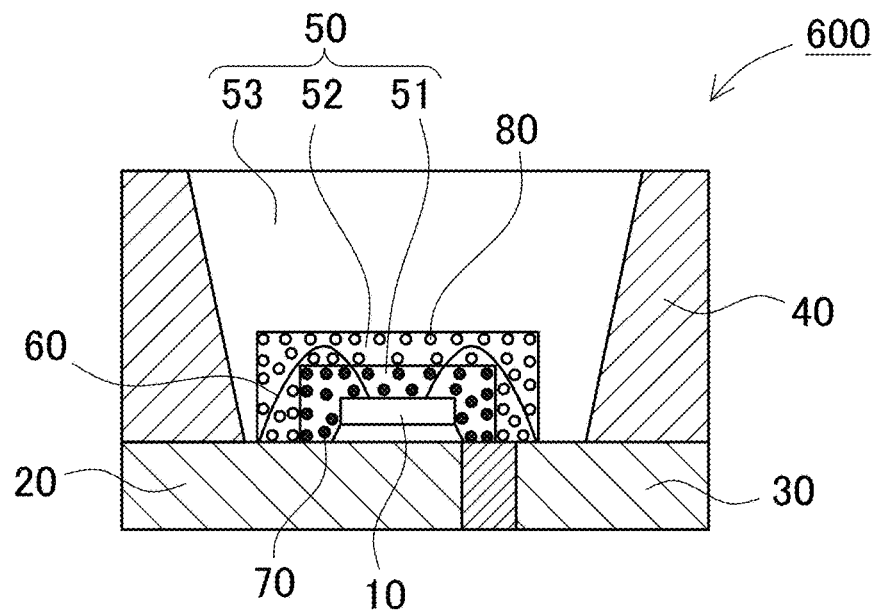
FIG. 7 is a schematic cross-sectional view showing a light emitting device according to a sixth embodiment of the present invention.

In a light emitting device 600 according to a sixth modified embodiment shown in FIG. 7, the sealing member is constructed of a plurality of sealing parts similar to the fifth modified embodiment. For example, the parts can be a first sealing portion 51 which includes the phosphor 70, and a second sealing portion 52 which includes the pigment 80 on or above the first sealing portion 51. The first and second sealing portions 51 and 52 are separately provided, and formed in layers so that each of the layers has a substantially uniform thickness in all directions. The sealing member which is constructed of the first and second sealing portions 51 and 52 can be formed by filling molds, which have shapes corresponding to the first and second sealing portions 51 and 52, with the resin materials, which contains the phosphor 70 and the pigment 80, and curing the resin materials corresponding to the first and second sealing portions 51 and 52. In addition, a third sealing member 53 covers the periphery of the second sealing portion 52. In the light emitting device according to the sixth embodiment, the sealing member 50 is constructed of the first sealing portion 51 which contains the phosphor 70, the second sealing portion 52 which contains the pigment 80, and the third sealing portion 53. The third sealing portion 53 may include a filler or diffusion material is required.

It is noted that the boundary between the first sealing portion 51 which contains the phosphor 70, and the sealing second portion 52 which contains the pigment 80 is clearly shown in FIG. 7 for ease of representation in the drawing. However, the present invention is not limited to this. The first sealing portion which includes the phosphor, and the sealing second portion which includes the pigment do not necessarily have a clear boundary between them. That is, no clear boundary may be formed between the first and second sealing portions. For example, the concentrations of the pigment and the phosphor may vary in the layer thickness direction.

Seventh Embodiment

Figure 8:
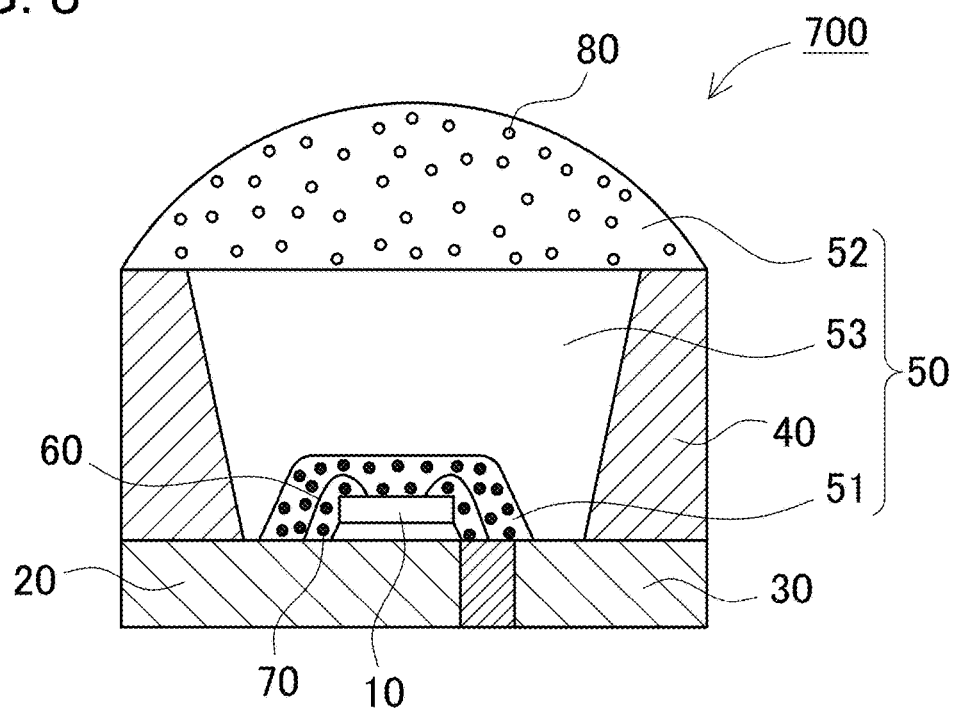
FIG. 8 is a schematic cross-sectional view showing a light emitting device according to a seventh embodiment of the present invention.

Although the pigment has been described which is arranged in proximity to the phosphor and the light emitting element in the foregoing embodiments, the present invention is not limited to this. That is, the aforementioned first sealing portion can be spaced away from the second sealing portion. For example, in a light emitting device 700 according to a seventh embodiment shown in FIG. 8, the phosphor 70 is arranged around the periphery of the light emitting element 10, while a third sealing member 53 which includes neither the phosphor 70 nor the pigment 80, is arranged between the phosphor 70 and the pigment 80 so that the second sealing portion 52 which includes the pigment 80 is arranged on or above the third sealing portion 53. Alternatively, the third sealing portion 53 may be omitted so that a hollow portion is formed in the recessed part of the molded member 40.

In the fifth to seventh embodiments where the pigment 80 is physically spaced away from the phosphor 70 as discussed above, the effect of absorbing a part of light from the light emitting element 10 by using the pigment 80 and extracting the rest of light from the light emitting device can be increased. In other words, in the case where the pigment is not spaced away from the phosphor, a part of light from the light emitting element may be extracted from the light emitting device without subjected to the control of the pigment. Contrary to this, in the case where the pigment is spaced away from the phosphor so that the pigment is arranged on the exterior side of the phosphor with respect to the light emitting element, the light from the light emitting element and the light from the phosphor can be more effectively subjected to the control of the pigment.

Eighth Embodiment

Figure 9:
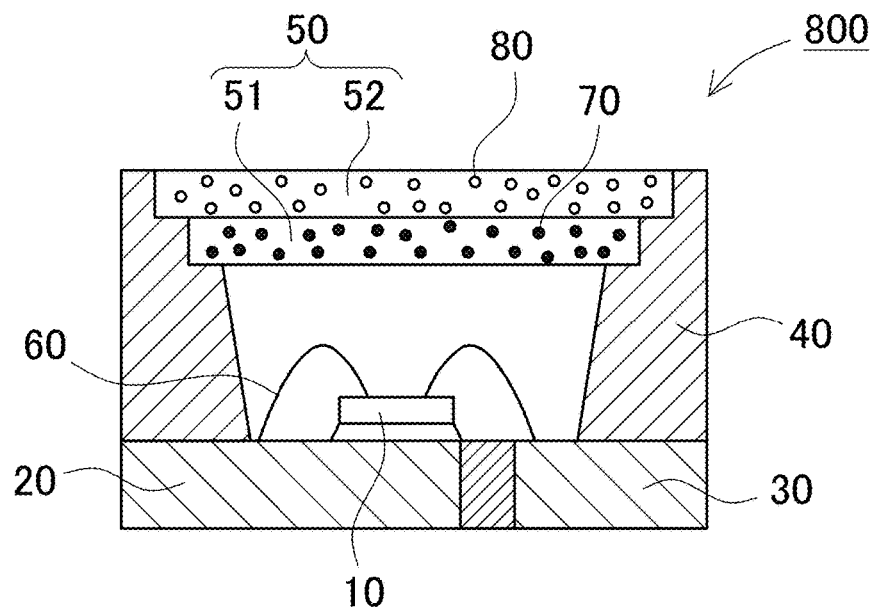
FIG. 9 is a schematic cross-sectional view showing a light emitting device according to an eighth embodiment of the present invention.

In a light emitting device 800 according to an eighth embodiment shown in FIG. 9, a first sealing portion 51 which includes the phosphor 70 is formed in a layer as well as the second sealing portion 52 which includes the pigment. The first sealing portion 51 is arranged under the second sealing portion 52 which includes the pigment 80 so that both the pigment 80 and the phosphor 70 are spaced away from the light emitting element 10. According to this arrangement, since the phosphor 70 is spaced away from the light emitting element 10, the phosphor 70 can be protected from heat from the light emitting element 10. In particular, this arrangement is effective for a heat-sensitive phosphor. Although the recessed part of the molded member 40 which accommodates the light emitting element 10 is hollow in the light emitting device 800 according to the eighth embodiment shown in FIG. 9, this hollow recessed part can be filled with a third sealing portion in a modified embodiment.

The first and second sealing portions may be arranged on the top surface of the molded member. For example, in the embodiments shown in FIGS. 5 and 8, the second sealing portion 52 which includes the pigment 80 is arranged on the top surface of the molded member 40, which has the recessed part.

The shape of the sealing portion which includes the pigment is not specifically limited. For example, the second sealing portion 52 which includes the pigment 80 has a lens shape similar to the aforementioned light emitting device 700 shown in FIG. 8.

Ninth Embodiment

Figure 10:
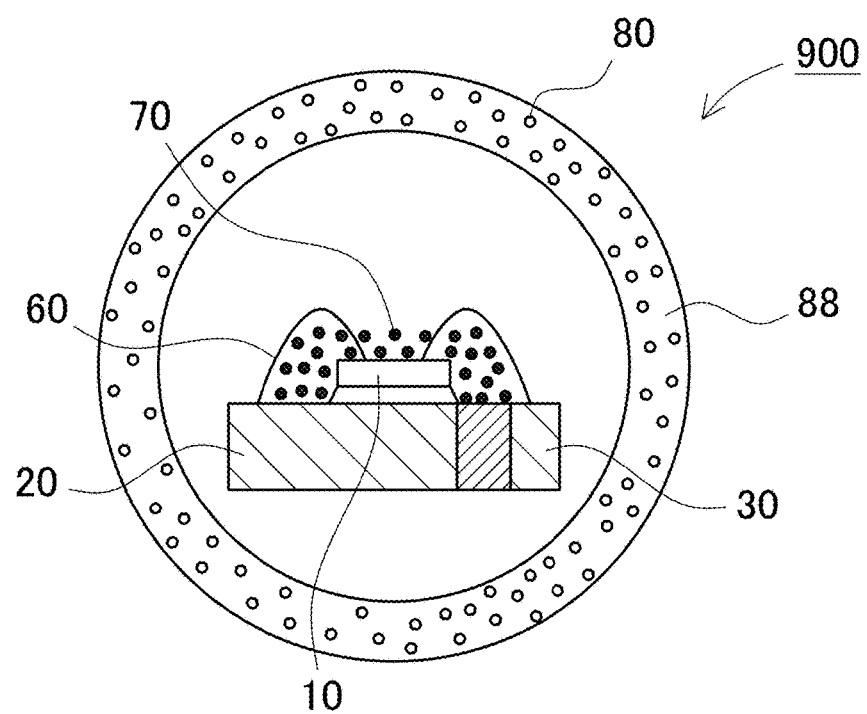
FIG. 10 is a schematic cross-sectional view showing a light emitting device according to a ninth embodiment of the present invention.

A light emitting device 900 according to a ninth embodiment shown in FIG. 10 includes a cylindrical covering member 88 which covers the periphery of the light emitting element 10 as viewed in cross-section. The covering member 88 includes the pigment 80. The part between the periphery of the light emitting element 10 and the covering member 88 can be hollow or filled with the third sealing portion. In another arrangement, the pigment 80 may be arranged on the surface of the covering member. In the case where the pigment 80 is included in an independent member separated from the sealing member that contains the phosphor 70, existing light emitting devices can be easily subjected to control of the pigment according to the present invention.

In the foregoing embodiments, the ratio (content) of the phosphor to the material of the first sealing portion falls within the range not smaller than 40% by weight and not greater than 140% by weight. The content of the phosphor preferably falls within the range not smaller than 50% by weight and not greater than 140% by weight, and more preferably not smaller than 70% by weight and not greater than 140% by weight. Also, the ratio (content) of the pigment to the material of the second sealing portion falls within the range not smaller than 0.3% by weight and not greater than 2.5% by weight. The content of the pigment preferably falls within the range not smaller than 0.3% by weight and not greater than 2.0% by weight, and more preferably not smaller than 0.3% by weight and not greater than 1.5% by weight. In the case where the contents of the phosphor and pigment are adjusted to these ranges, monochromatic red light can be efficiently extracted from the light emitting device.

(Sealing Member 50)

The sealing member 50 which is constructed of the first and second sealing portions 51 and 52 is formed of light-transmissive resin or glass. The recessed part of the light emitting device 100 is filled with the light-transmissive resin or glass so that the light emitting element 10 is covered by the sealing member 50. In terms of ease of production, the sealing member is preferably formed of a light-transmissive resin. In terms of lightfastness, silicone resin compositions and the like are preferably used as the light-transmissive resin. However, electrically insulating resin compositions such as epoxy resin composition, acrylic resin composition or the like can be also used. Another member can be suitably included together with the phosphor 70 and the pigment 80 in the sealing member 50. For example, in addition to the pigment 80, other diffusion members can be added to the sealing member 50. In this case, the directivity from the light emitting element 10 can be reduced so that the viewing angle can be increased. Examples of other diffusion members can be provided by particles of silica and alumina.

The following description will describe light emitting devices according to examples of the present invention. Needless to say, the present invention is not limited to the examples described below.

Examples 1-6

Figure 11:
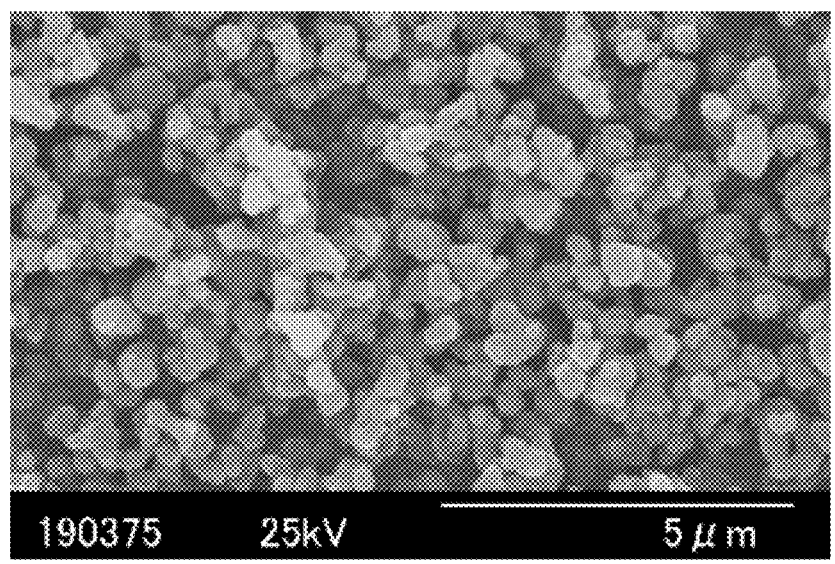
FIG. 11 is a SEM image of a pigment according to the first embodiment of the present invention.
Figure 12:
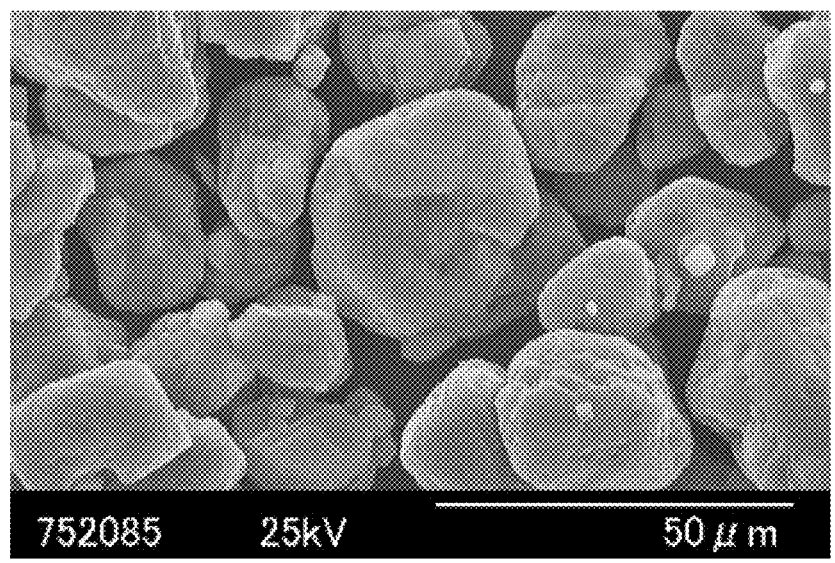
FIG. 12 is a SEM image of a red phosphor according to the first embodiment of the present invention.

Light emitting devices according to examples 1 to 6 are produced which include a light emitting element which has a light emission peak wavelength of 440 nm, a pigment of (Ti, In, Sb)$O_2$ which is commercially available, and a KSF phosphor (composition $K_2SiF_6:Mn^{4+}$) as the red phosphor. FIG. 11 shows a SEM image of the pigment used in these examples. Also, FIG. 12 shows a SEM image of the res phosphor used in these examples.

Figure 13:
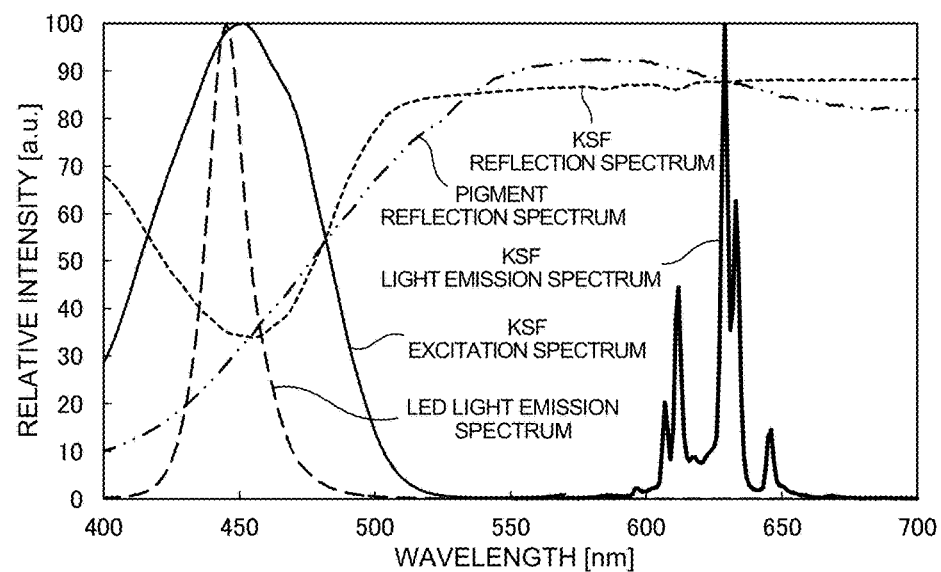
FIG. 13 is a graph showing the reflection spectrum of the pigment, the light emission spectrum of a light emitting element, and the reflection, light emission and excitation spectra of the red phosphor according to the first embodiment of the present invention.

FIG. 13 is a graph showing the reflection, light emission and excitation spectra of the red phosphor, the light emission spectrum of the light emitting element for exciting the red phosphor, and the reflection spectrum of the pigment according to the these examples.

The minimum value of the reflectance of the pigment according to these examples is 31.5% at the wavelength of 440 nm, which corresponds to the light emission peak wavelength of the light emitting element for exciting the red phosphor, while the relative minimum value is 80% in the wavelength range not shorter than 600 nm and not longer than 700 nm within which the light emission peak wavelength 629 nm of the red phosphor falls. That is, these reflectance values of the pigment according to these examples satisfy the conditions that the reflectance of the pigment is not greater than 40% in the wavelength range not shorter than 400 nm and not longer than 460 nm, and is not smaller than 75% in the wavelength range not shorter than 600 nm and not longer than 700 nm.

In these examples, the pigment can absorb light that is emitted by the light emitting element and is not absorbed by quently, the recessed part of the molded member, which is previously prepared, is filled with the mixture. The sealing member is formed by curing the resin. The light emitting device according to the examples 1 and 3 is shown in the cross-sectional view of FIG. 2A.

In the light emitting devices according to the examples 2 and 4 to 6, and a light emitting device according to the example 7, the red phosphor is mixed in a silicone resin as the material of the sealing member. The recessed part of the molded member is filled with the mixture, and the resin is then cured. Subsequently, a silicone resin that includes the pigment is arranged on the resin that includes the phosphor, and is then cured. The other members in the examples 2, and 4 to 7 are formed similar to the examples 1 and 3. The light emitting device according to the examples 2, and 4 to 7 is shown in the cross-sectional view of FIG. 5.

Comparative Examples 1 to 5

The light emitting devices according to comparative examples 1 to 5 are produced similarly to these examples except that the pigment is not included or the content of the pigment is different from these examples.

Example 7

The light emitting device according to an example 7 is produced similar to the example 2 except that the pigment is changed to a perylene-based pigment, and the content of the pigment is changed to the value shown in Table 1.

Table 1 also shows the measured results of the light emission properties of the light emitting devices according to the examples and the comparative examples.

TABLE 1

|  | Content of Red Phosphor in Resin (wt. %) | Content of Pigment in Resin (wt. %) | Relative Luminous Flux (%) | X of Chromaticity | Y of Chromaticity | Ratio of Light Emission Peak Intensity |
|---|---|---|---|---|---|---|
| Comp. Ex. 1 | 70 | — | — | 0.446 | 0.182 | 0.14 |
| Ex. 1 |  | 1.0 | 100.0 | 0.625 | 0.278 | 0.02 |
| Ex. 2 |  | 2.5 | 145.4 | 0.670 | 0.299 | 0.00 |
| Comp. Ex. 2 | 140 | — | — | 0.545 | 0.234 | 0.06 |
| Ex. 3 |  | 1.0 | 129.5 | 0.658 | 0.293 | 0.01 |
| Ex. 4 |  | 1.0 | 195.8 | 0.648 | 0.287 | 0.01 |
| Ex. 5 |  | 2.5 | 162.8 | 0.681 | 0.303 | 0.00 |
| Comp. Ex. 3 | 20 | — | — | 0.289 | 0.098 | 0.53 |
| Comp. Ex. 4 |  | 2.5 | — | 0.574 | 0.254 | 0.04 |
| Comp. Ex. 5 | 40 | — | — | 0.371 | 0.142 | 0.25 |
| Ex. 6 |  | 2.5 | 129.9 | 0.646 | 0.288 | 0.01 |
| Ex. 7 | 70 | 0.3 | 139.2 | 0.651 | 0.277 | 0.01 | the red phosphor for excitation. According to this construction, in particular, in the case of a small light emitting device, even if the available amount of the red phosphor is limited in the light emitting device, the color purity of the monochromatic light emitted by the light emitting device can be improved.

Table 1 shows the contents of the red phosphor and the pigment in the sealing member according to these examples.

In the examples 1 and 3, the pigment and the red phosphor are mixed in a silicone resin as the material of the sealing member so that the phosphor and the pigment are substantially uniformly distributed in the sealing member. Subse- It is noted that the content of red phosphor or pigment in resin is represented by percentage by weight where the resin is defined 100 in Table 1.

Figure 14:
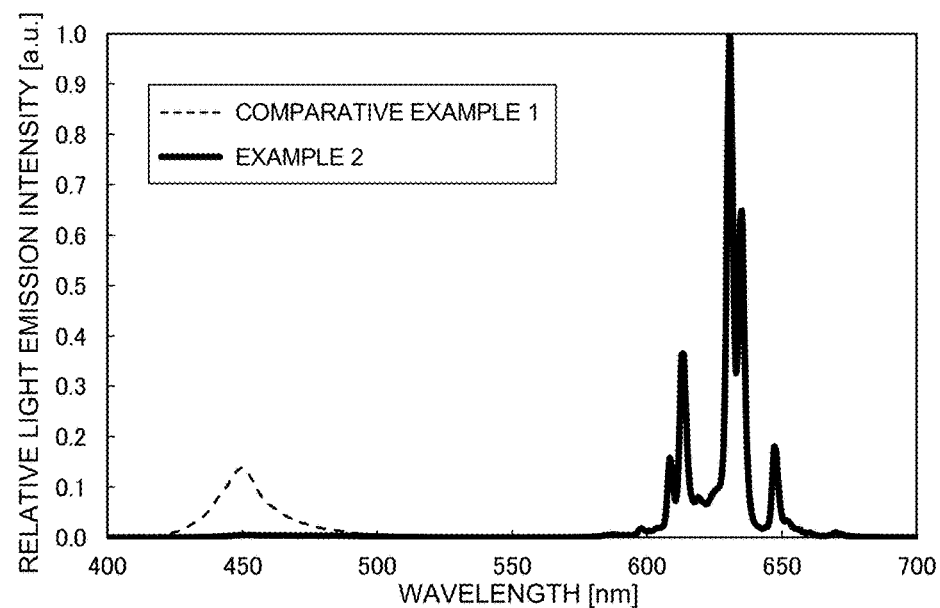
FIG. 14 is a graph showing the light emission spectra of light emitting devices according to an example and a comparative example.

FIG. 14 shows the light emission spectra of the light emitting devices according to the example 2 and the comparative example 1. As the dotted line in FIG. 14, the light emission spectrum of the light emitting device according to the comparative example 1 has a relatively high light emission intensity around the light emission peak wavelength 450 nm of the light emitting element. As shown in Table 1, the ratios of the light emission intensities of a light emitting peak of the light emitting element in the comparative examples 1, 3 and 5 are greater than 0.10 with respect to the maximum light emission intensity of the light emitting device in the range not shorter than 600 nm and not longer than 700 nm. For example, the ratio in the comparative example 1 is 0.14. Correspondingly, in the light emitting devices according to these comparative examples, x values of the chromaticity of their light emission are smaller than 0.60, as shown in Table 1. This shows that their purities of red light are low.

Here, it may be considered that light with a wavelength of 450 nm is completely absorbed by increasing the content of the red phosphor. However, although the content of the phosphor is high (e.g., in the case of the comparative example 2), it is difficult that a light emitting device with high color purity is provided by only increasing the red phosphor as shown in Table 1.

The contents of the red phosphor in the light emitting devices according to the examples 1 to 7 fall within the range not smaller than 40% by weight and not greater than 140% by weight with respect to the resin as the material of the sealing member, and the contents of the pigment fall within the range not smaller than 0.3% by weight and not greater than 2.5% by weight with respect to the resin as the material of the sealing member. Almost no light emission intensity is observed around 450 nm in the light emitting devices according to the examples 1 to 7. For example, the thick line in FIG. 14 shows the light emission spectrum of the light emitting device according to the example 2 which includes almost no light emission intensity around 450 nm. That is, the ratios of the light emission intensity of the light emitting device at the light emission peak wavelength of the light emitting elements according to these examples are not greater than 0.10 with respect to the maximum light emission intensity of the light emitting device in the range not shorter than 600 nm and not longer than 700 nm. Also, in the light emitting devices according to these examples, x values of the chromaticity of their light emission are higher than 0.60, as shown in Table 1. This shows that their purities of red light are high.

On the other hand, in comparison between the case of the examples 1 and 3, and the case of the examples 2 and 4 to 7, where their arrangements of the pigment and the red phosphor are different, x values of the chromaticity in case of the examples 2, and 4 to 7 is high rather than the case of the examples 1 and 3. This shows that the purities of red light in the case of the examples 2 and 4 to 7 are higher than the case of the examples 1 and 3. The reason is assumed that in the case of the examples 1 and 3 there is a high possibility that a part of light from the light emitting element that is absorbed neither by the red phosphor nor the pigment is extracted from the light emitting device, while in the case of examples 2 and 4 to 7 there is a high possibility that a part of light from the light emitting element that is not absorbed by the red phosphor is absorbed by the pigment.

In addition, it is found that the luminous fluxes in the examples 2 and 4 to 7 are higher than the examples 1 and 3. The reason is assumed that in the examples 2 and 4 to 7 the pigment absorbs only a part of light from the light emitting element that has been not absorbed by the red phosphor for excitation, while in the examples 1 and 3 the pigment absorbs a relatively large amount of light which will be absorbed by the red phosphor for excitation so that the amount of light that is absorbed by the red phosphor for excitation decreases, and as a result the amount of light from the red phosphor decreases.

A light emitting device according to the present invention can be used as a red monochromatic light emitting device for illumination, or for a display, radar indicator, or the like.

What is claimed is:

1. A light emitting device comprising:
    a light emitting element that has a light emission peak wavelength in the range not shorter than 400 nm and not longer than 460 nm;
    a phosphor that can be excited by light from said light emitting element, and emit luminescent radiation with a light emission peak wavelength in the range not shorter than 600 nm and not longer than 700 nm;
    a pigment that absorbs a part of the light from said light emitting element; and
    a sealing member that includes said phosphor and said pigment, and covers said light emitting element, wherein
        starting at said light emitting element, a concentration of said phosphor decreases toward an outer edge of said sealing member faster than a concentration of said pigment, and
        x of the light emission chromaticity of the light emitting device falls within the range of x≥0.600 in the chromaticity coordinates in the CIE 1931 color space chromaticity diagram.

2. The light emitting device according to claim 1, wherein said sealing member includes a portion that contains mixture of said phosphor and said pigment, a portion that has a higher content of said pigment than the content of said phosphor, and a portion that substantially contains neither said phosphor nor said pigment in this order from the light-emitting-element side.

3. The light emitting device according to claim 1, wherein the reflectance of said pigment is not greater than 40% in the wavelength range not shorter than 400 nm and not longer than 460 nm.

4. The light emitting device according to claim 1, wherein the reflectance of said pigment is not smaller than 75% in the wavelength range not shorter than 600 nm and not longer than 700 nm.

5. The light emitting device according to claim 1, wherein the content of said phosphor falls within the range not smaller than 40% by weight and not greater than 140% by weight with respect to the material of the sealing member which includes said phosphor.

6. The light emitting device according to claim 1, wherein the content of said pigment falls within the range not smaller than 0.3% by weight and not greater than 2.5% by weight with respect to the material of the sealing member which includes said pigment.

7. The light emitting device according to claim 1, wherein the ratio of the light emission intensity of the light emitting device at the light emission peak wavelength of said light emitting element is not greater than 0.10 with respect to the maximum light emission intensity of the light emitting device in the range not shorter than 600 nm and not longer than 700 nm.

8. The light emitting device according to claim 1, wherein said phosphor contains $Mn^{4+}$ as an activator.

9. The light emitting device according to claim 8, wherein said phosphor includes a phosphor member the composition of which is represented by the following general formula (I)

$$A_2[M_{1-a}M_aF_6] \quad (I)$$

where A is at least one selected from the group consisting of $K^+$, $Li^+$, $Na^+$, $Rb^+$, $Cs^+$ and $NH^{4+}$, M is at least one element selected from the group consisting of the group 4 elements and the group 14 elements, and a satisfies 0<a<0.2.

10. The light emitting device according to claim 8, wherein said phosphor includes a phosphor member the composition of which is 3.5MgO.0.5MgF$_2$.GeO$_2$:Mn, or is represented by the following general formula (II)

$(x-a)$MgO.$a$(M$a$)O.$b$/2(M$b$)$_2$O$_3$.$y$MgF$_2$.$c$(M$c$)X$_2$.$(1-d-e)$GeO$_2$.$d$(M$d$)O$_2$.$e$(M$e$)$_2$O$_3$:Mn     (II)

where Ma is at least one element selected from the group consisting of Ca, Sr, Ba and Zn, Mb is at least one element selected from the group consisting of Sc, La and Lu, Mc is at least one element selected from the group consisting of Ca, Sr, Ba and Zn, X is at least one element selected from the group consisting of F and Cl, Md is at least one element selected from the group consisting of Ti, Sn and Zr, Me is at least one element selected from the group consisting of B, Al, Ga and In, and x, y, a, b, c, d and e satisfy 2≤x≤4, 0<y≤2, 0≤a≤1.5, 0≤b<1, 0≤c≤2, 0≤d≤0.5 and 0≤e<1, respectively.

11. The light emitting device according to claim 1, wherein said pigment is an antimony-nickel-titanium-based oxide or a perylene-based pigment.

12. The light emitting device according to claim 1, wherein the specific gravity of said phosphor is greater than the specific gravity of said pigment.

13. The light emitting device according to claim 1, wherein said phosphor includes at least one selected from the group consisting of (Ca$_{1-x}$Sr$_x$)AlSiN$_3$:Eu (0≤x≤1.0), (Ca$_{1-x-y}$Sr$_x$Ba$_y$)$_2$Si$_5$N$_8$:Eu(0≤x≤1.0, 0≤y≤1.0), (Sr,Ca)AlSiN$_3$:Eu, CaAlSiN$_3$:Eu, and (Ca, Sr)LiAl$_3$N$_4$:Eu.

14. The light emitting device according to claim 1, wherein a mean particle diameter of said pigment is smaller than a mean particle diameter of said phosphor.

15. The light emitting device according to claim 1, wherein a mean particle diameter of said phosphor is greater than or equal to 1 μm and smaller than or equal to 50 μm.

16. The light emitting device according to claim 1, wherein a mean particle diameter of said pigment is smaller than or equal to 10 μm.

* * * * *